(12) United States Patent
Marinis et al.

(10) Patent No.: US 6,770,503 B1
(45) Date of Patent: Aug. 3, 2004

(54) INTEGRATED PACKAGING OF MICROMECHANICAL SENSORS AND ASSOCIATED CONTROL CIRCUITS

(75) Inventors: Thomas F. Marinis, Haverhill, MA (US); Jerome B. Sohn, Sudbury, MA (US); Richard P. Tumminelli, Ashland, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 09/422,682

(22) Filed: Oct. 21, 1999

(51) Int. Cl.⁷ .......................... H01L 21/00; H01L 21/44; H01L 27/14
(52) U.S. Cl. .......................... 438/48; 438/67; 438/107; 257/444
(58) Field of Search .............................. 438/48–50, 51, 438/53, 52, 106, 107, 110, 113, 406, 455, 456, 458, 459, 460, 462, 700, 701, 702, 719, 753, 977, 667; 257/414, 417, 419, 444; 73/861.47, 777, 514.32–514.34

(56) References Cited

U.S. PATENT DOCUMENTS

| | | | |
|---|---|---|---|
| 4,670,770 A | 6/1987 | Tai | 357/60 |
| 4,782,028 A | 11/1988 | Farrier et al. | 437/3 |
| 4,874,500 A | 10/1989 | Madou et al. | 204/412 |
| 5,294,760 A | 3/1994 | Bower et al. | 200/83 |
| 5,323,051 A | 6/1994 | Adams et al. | 257/417 |
| 5,353,638 A | 10/1994 | Marek | 73/204.26 |
| 5,406,163 A | 4/1995 | Carson et al. | 310/334 |
| 5,608,263 A | 3/1997 | Drayton et al. | 257/728 |
| 5,659,195 A | 8/1997 | Kaiser et al. | 257/415 |
| 5,706,565 A | 1/1998 | Sparks et al. | 29/25.42 |
| 5,719,069 A | 2/1998 | Sparks | 437/59 |
| 5,725,729 A | 3/1998 | Greiff | 156/657.1 |
| 5,729,053 A | 3/1998 | Orthmann | 257/724 |
| 5,747,705 A | 5/1998 | Herb et al. | 73/862.59 |

*Primary Examiner*—Savitri Mulpuri
(74) *Attorney, Agent, or Firm*—Weingarten, Schurgin, Gagnebin & Lebovici LLP

(57) ABSTRACT

A micromechanical sensor is fabricated on a semiconductor wafer, and a control circuit is fabricated on another semiconductor wafer. A cavity is etched on the back side of the control circuit wafer, the cavity being formed such that the sensor on the other wafer fits within the cavity when the wafers are brought together in an adjoining relationship. Through-holes are etched through the back side of the control circuit wafer to allow access to electrical contact points, and a patterned layer of metal is deposited to form electrical interconnections between the electrical contact points and termination points on the back side of the wafer via the through-holes. The termination points are arranged such that electrical contacts of the sensor contact the termination points when the wafers are placed in the adjoining relationship. The wafers are then cleaned and bonded together in the adjoining relationship. In a typical process the wafers contain multiple sensors and control circuits, respectively, and thus the bonded wafers are diced to yield individual bonded sensor-circuit pairs. The bonded pairs are then packaged in an integrated-circuit package such as a leadless chip carrier in a known manner.

16 Claims, 1 Drawing Sheet

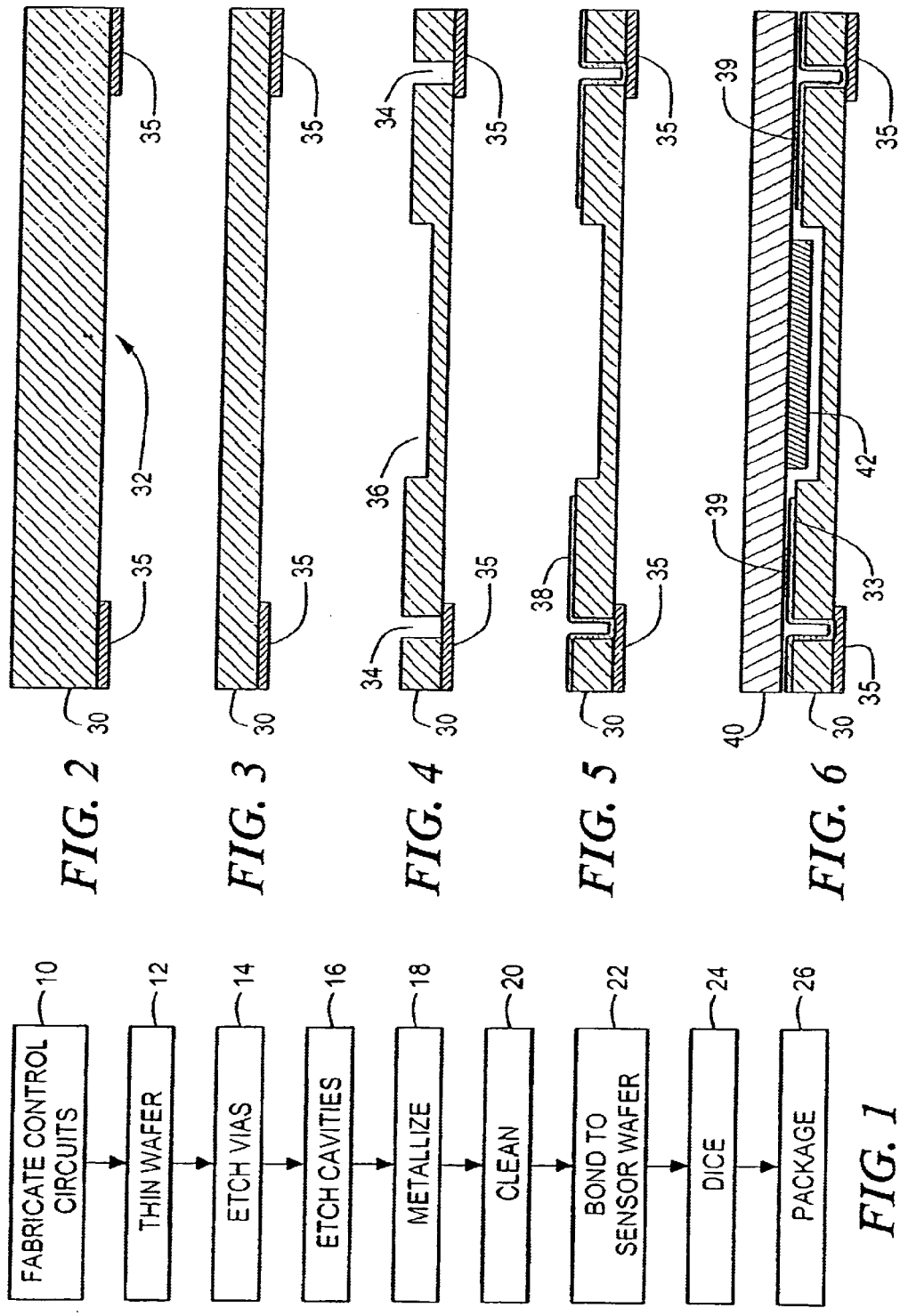

INTEGRATED PACKAGING OF MICROMECHANICAL SENSORS AND ASSOCIATED CONTROL CIRCUITS

CROSS REFERENCE TO RELATED APPLICATIONS

None

STATEMENT REGARDING FEDERALLY SPONSORED RESEARCH OR DEVELOPMENT

Not Applicable

BACKGROUND OF THE INVENTION

The present invention is related to the field of sensors and their associated sensor control circuitry, and more particularly to the mechanical packaging of systems such as gyroscopes and accelerometers that employ sensors and sensor control circuitry.

Many types of systems use sensors to detect the value of a property of a physical system and to generate a corresponding electrical signal representative of the sensed value. The electrical signals from sensors are commonly provided to electrical circuitry off chip or in adjacent locations on chip in order to enable a desired function to be performed. For example, inertial guidance systems use gyroscopes and accelerometers to monitor the orientation of an object in flight and the direction and magnitude of forces experienced by the object. The gyroscopes and accelerometers rely on electromechanical sensors that translate particular types of motion, such as rotational or linear acceleration, into corresponding electrical signals.

It has become possible to fabricate very small or micromechanical sensors out of silicon wafers of the type used in the manufacture of integrated circuits. Micromechanical sensors are comparable in size to integrated circuits (IC's). During fabrication of micromechanical sensors, silicon wafers containing numerous sensors are diced into individual sensors, and the sensors are individually mounted into packages of the type used for integrated circuits, such as sealed leadless ceramic chip carriers. The packaged sensor is then mounted on a printed circuit board along with an associated control circuit, usually an IC itself and packaged in a similar manner. The sensor and control circuit, along with other circuit components as required, collectively perform the desired sensing function.

One of the drawbacks of the above-described method of packaging sensor-based systems is that individual unprotected sensors must be handled during packaging operations, potentially reducing yield and increasing manufacturing costs. Also, the sensor package is generally significantly larger and more expensive than the sensor, so the package contributes notably to the dimensions and cost of the assembled printed circuit board. Also, mounting the sensor in a package such as a chip carrier limits how close the sensor can be placed to the control integrated circuit, which in turn can unnecessarily limit the electrical performance of the sensor-based system or increase the susceptibility to noise.

It would be desirable to improve the cost, size, and performance of systems employing micromechanical sensors and associated control circuitry.

BRIEF SUMMARY OF THE INVENTION

In accordance with the present invention, a method of fabricating and packaging micromechanical sensors and their associated control circuitry is disclosed that eliminates the need for a separate carrier package for the sensor. The disclosed packaging method advantageously eliminates the handling of exposed sensors during packaging operations, and results in closer placement of the sensor and its associated control circuit, so that costs are reduced and greater system performance can be achieved.

In the disclosed fabrication method, a micromechanical sensor is fabricated on a semiconductor wafer, and a control circuit is fabricated on another semiconductor wafer. A cavity is etched on the back side of the control circuit wafer, the cavity being formed such that the raised portion of a sensor fabricated on the other wafer fits within the cavity when the wafers are brought together in an adjoining relationship. Through-holes are etched through the back side of the control circuit wafer to allow access to electrical contact points of the sensor circuit, and a patterned layer of metal is deposited to form electrical interconnections between the electrical contact points and termination points on the back side of the control circuit wafer via the through-holes. The termination points are arranged such that electrical contacts of the sensor contact the termination points when the wafers are placed in the adjoining relationship. The wafers are then cleaned and bonded together in the adjoining relationship. In a typical process the respective wafers contain multiple sensors and control circuits, respectively, and thus the bonded wafers are diced to yield individual bonded sensor-circuit pairs. The bonded pairs are then packaged in a known manner.

The fabrication method eliminates the need for separate packages for the sensor and control circuit. Also, processing is done at the wafer clean room level so that the handling of individual exposed sensors is eliminated. The sensor and control circuit in each bonded pair are placed in intimate contact, thus reducing overall size and improving electrical performance, and the pairs can be packaged using conventional integrated-circuit packaging technology.

Other aspects, features, and advantages of the present invention are disclosed in the detailed description which follows.

BRIEF DESCRIPTION OF THE SEVERAL VIEWS OF THE DRAWING

FIG. 1 is a flow diagram of a sensor packaging method according to the present invention;

FIGS. 2 through 5 are schematic depictions of a control-circuit wafer at various stages in the packaging method of FIG. 1; and FIG. 6 is a schematic depiction of a bonded sensor and control circuit pair resulting from the packaging method of FIG. 1.

DETAILED DESCRIPTION OF THE INVENTION

In the process of FIG. 1, an array of control circuits are fabricated on a semiconductor wafer at step 10 using conventional integrated-circuit fabrication techniques. The resulting control circuits may be completely custom-designed, or may be of the type known as "application-specific integrated circuits" or ASICs. The layout of the array of control circuits mirrors that of a corresponding array of sensors on a separate wafer, so that when the wafers are placed in an aligned adjoining relationship each control circuit is aligned with a corresponding sensor. This arrangement facilitates a subsequent fabrication step in which the wafers are bonded together, as described below.

FIG. 2 shows a site on a wafer 30 where a single control circuit 32 is formed. FIGS. 2 through 6 show the results of steps from the process of FIG. 1 at the site for a single sensor and control circuit pair. However, it is to be understood that the same results are obtained for each sensor and control circuit pair from the two wafers being processed, so that a complete picture of the process results would simply show an array of identical sites on the wafers.

In step 12 of FIG. 1, the upper portions of the control circuit wafer 30 are removed by known mechanical and/or chemical means, resulting in a thinned wafer 30 as shown in FIG. 3.

In step 14, through-hole vias 34 are etched in the backside of the control circuit wafer 30 to allow access to input and output contact pads 35 of the control circuit 32 from the backside of the control circuit wafer 30. In step 16, a second etch process is conducted to form cavities 36 for the sensors on the backside of the control circuit wafer. The results of these etching steps are shown in FIG. 4.

In step 18, the back side of the control circuit wafer 30 is metallized with a patterned layer 38 of metal to create electrical interconnections in the previously-etched vias 34 to the electrical input and output contact pads 35 of the control circuit 32. The interconnections extend to include contact pads 33 on the back side of the control circuit wafer 30 as a part of layer 38. Corresponding contact points 39 on the sensors for input and/or output signals (I/O) are pressed against the contact pads 33 during subsequent bonding of the wafers to complete the electrical interconnection between them. The result of the metallization step 18 is shown in FIG. 5.

In step 20, the control circuit wafer 30 and a sensor wafer 40 are cleaned under high vacuum conditions. While this high vacuum is maintained, the wafers are bonded together in step 22 using heat and/or pressure in known bonding techniques. The result of the bonding is a bonded component as shown in FIG. 6 including a control circuit 32 and an associated sensor 42 interconnected with the control circuit via the pads 33 in layers 38 that contact the sensor contacts 39 and disposed in the etched cavity 36 on the back side of tie control circuit wafer 30.

In the remaining steps 24 and 26, the bonded wafers are diced and the individual bonded components are packaged in an integrated circuit package such as a leadless chip carrier. The packaged component can then be mounted on a printed circuit board or other circuit substrate that provides power inputs and receives instrument outputs as required by the system in which it is used.

While the above description is of a preferred embodiment and best mode, the sensor circuit and control circuit can be placed both on outer wafer surfaces, or the control circuit placed in a back side cavity of the sensor wafer.

A method of fabricating and packaging micromechanical sensors and their associated control circuits has been shown. It will be apparent to those skilled in the art that modification to and variation of the above-described methods and apparatus are possible without departing from the inventive concepts disclosed herein. Accordingly, the invention should be viewed as limited solely by the scope and spirit of the appended claims.

What is claimed is:

1. A method of packaging a micromechanical sensor with an associated control circuit, comprising:

fabricating the sensor on a front side of a first wafer of semiconductor material, said sensor having electrical contact points of electrical I/O;

fabricating the control circuit on a front side of a second wafer of semiconductor material, said control circuit having electrical contacts;

forming a cavity on the back side of the second wafer, the cavity being formed such that the sensor fits within the cavity when the front side of the first wafer is placed in an adjoining relationship with the back side of the second wafer;

forming through-holes in the second wafer at locations adjacent to the cavity allowing access to the electrical contacts of the control circuit from the back side of the second wafer;

depositing a patterned layer of metal on the back side of the second wafer and in the through holes to form electrical interconnections to the electrical contacts of the control circuit via the through-holes, the interconnections terminating in back-side termination points arranged such that electrical contact points of the sensor contact the termination points when the wafers are placed in an adjoining relationship; and subsequent to the depositing step, bonding the first wafer and the metallized second wafer together in the adjoining relationship.

2. A method according to claim 1, further comprising the step of removing substrate material from the back side of the second wafer to reduce the thickness thereof.

3. A method according to claim 1, further comprising the step of cleaning the wafers prior to the bonding step.

4. A method according to claim 1, wherein the bonding step results in the wafers being bonded at least in an area adjacent to the sensor and control circuit, and further comprising the step of separating the bonded control circuit and sensor from the remainder of the bonded wafers.

5. A method according to claim 4, further comprising the step of packaging the bonded control circuit and sensor in an integrated-circuit package.

6. A method according to claim 5, wherein the integrated-circuit package is a leadless chip carrier.

7. A method according to claim 1, wherein the step of forming the cavity comprises etching the cavity.

8. A method according to claim 1, wherein the step of forming the through-holes comprises etching the through-holes.

9. A method of packaging micromechanical sensors and associated control circuits, comprising:

fabricating the sensors on a front side of a first wafer of semiconductor material;

fabricating the control circuits on a front side of a second wafer of semiconductor material, the control circuits being arranged such that each control circuit is mutually aligned with an associated sensor when the front side of the first wafer is placed in an adjoining relationship with the back side of the second wafer;

forming cavities on the back side of the second wafer, the cavities being arranged such that each sensor on the first wafer fits within an associated cavity when the first and second wafers are placed in the adjoining relationship;

forming through-holes in the second wafer at locations adjacent to the cavities allowing access to electrical contact points on the front side of the second wafer from the back side thereof;

depositing a patterned layer of metal on the back side of the second wafer and in the through holes to form electrical interconnections between termination points on the back side of the wafer and the electrical contact points on the front side of the wafer via the through-holes, the termination points being arranged such that the electrical contacts on the front side of the first wafer contact the termination points when the wafers are placed in the adjoining relationship;

subsequent to the depositing step, bonding the first and second wafers together in the adjoining relationship, the wafers being bonded together at least at points adjacent to the control circuits and sensors; and cutting the bonded wafers into sections each including a control circuit and the associated sensor bonded thereto.

10. A method according to claim 9, further comprising the step of removing substrate material from the back side of the second wafer to reduce the thickness thereof.

11. A method according to claim 9, further comprising the step of cleaning the wafers prior to the bonding step.

12. A method according to claim 9, further comprising the step of packaging each bonded control circuit and sensor in a corresponding integrated-circuit package.

13. A method according to claim 12, wherein the integrated-circuit package is a leadless chip carrier.

14. A method according to claim 9, wherein the step of forming the cavities comprises etching the cavities.

15. A method according to claim 9, wherein the step of forming the through-holes comprises etching the through-holes.

16. A sensor and control circuit assembly, comprising:

a planar monolithic circuit substrate having a control circuit formed on a front side and electrical contact pads on both the front side and a back side, the front-side contact pads extending over respective through-holes formed in the substrate, the back side of the substrate including a pattern of metallization interconnecting the back-side contact pads with the front-side contact pads via the through-holes, the metallization being in contact with the walls of the through holes and with the front-side contact pads, the back side of the substrate further including a cavity; and a planar sensor substrate bonded to the back side of the circuit substrate, the sensor substrate having a micromechanical sensor formed thereon, the sensor being disposed in the cavity of the circuit substrate, the sensor being electrically connected to the control circuit via contact pads on the sensor substrate contacting the back-side contact pads of the circuit substrate.

\* \* \* \* \*

UNITED STATES PATENT AND TRADEMARK OFFICE
CERTIFICATE OF CORRECTION

PATENT NO. : 6,770,503 B1
DATED : August 3, 2004
INVENTOR(S) : Thomas F. Marinis et al.

It is certified that error appears in the above-identified patent and that said Letters Patent is hereby corrected as shown below:

Column 3,
Line 41, "tie" should read -- the --.

Signed and Sealed this

Twenty-fourth Day of January, 2006

JON W. DUDAS
*Director of the United States Patent and Trademark Office*